United States Patent [19]

Hori et al.

[11] Patent Number: 5,320,974
[45] Date of Patent: Jun. 14, 1994

[54] METHOD FOR MAKING SEMICONDUCTOR TRANSISTOR DEVICE BY IMPLANTING PUNCH THROUGH STOPPERS

[75] Inventors: Atsushi Hori, Moriguchi; Mizuki Segawa, Yawata; Hiroshi Shimomura, Moriguchi; Shuichi Kameyama, Itami, all of Japan

[73] Assignee: Matsushita Electric Industrial Co., Ltd., Osaka, Japan

[21] Appl. No.: 31,761

[22] Filed: Mar. 15, 1993

Related U.S. Application Data

[62] Division of Ser. No. 919,202, Jul. 23, 1992, abandoned.

[30] Foreign Application Priority Data

Jul. 25, 1991 [JP] Japan ................. 3-186128

[51] Int. Cl.⁵ ........................................... H01L 21/266
[52] U.S. Cl. ............................................ 437/44; 437/35; 437/45; 437/200
[58] Field of Search .................. 437/29, 30, 35, 44, 437/45, 149, 196, 200; 148/DIG. 82, DIG. 147

[56] References Cited

U.S. PATENT DOCUMENTS

| | | | |
|---|---|---|---|
| 4,599,118 | 7/1986 | Han et al. | 437/41 |
| 4,649,629 | 3/1987 | Miller et al. | 437/45 |
| 4,729,001 | 3/1988 | Haskell | 257/345 |
| 4,873,557 | 10/1989 | Kita | 257/344 |
| 4,980,744 | 12/1990 | Watanabe et al. | 257/372 |
| 5,171,700 | 12/1992 | Zamanian | 437/44 |
| 5,254,490 | 10/1993 | Kondo | 437/200 |
| 5,270,226 | 12/1993 | Hori et al. | 437/35 |

FOREIGN PATENT DOCUMENTS 2-305444 12/1990 Japan .

Primary Examiner—Brian E. Hearn
Assistant Examiner—Chandra Chaudhari
Attorney, Agent, or Firm—Renner, Otto, Boisselle & Sklar

[57] ABSTRACT

Insulating films formed on side walls of a gate electrode are removed for a self-alignment to selectively implant impurities only into end portions of a source region and a drain region. Therefore, $p^+$-type semiconductor regions are selectively formed only on sides near a channel region of the source and the drain regions. A punch through of the source or drain region is prevented by the $p^+$-type semiconductor regions controlling an inversion threshold voltage. Therefore, the impurity concentration of the p-type substrate can be settled low, and the semiconductor transistor device can be miniaturized without increasing a parasitic junction capacitance. Moreover, since the impurity concentration in the channel region is ununiform, a drivability of the transistor can be increased. As a result, a semiconductor transistor device with a high withstand voltage and a high drivability in which the inversion threshold voltage can be easily controlled, and a method for producing the same are provided.

7 Claims, 10 Drawing Sheets

○— PRESENT INVENTION
●— CONVENTIONAL

○— PRESENT INVENTION
●— CONVENTIONAL

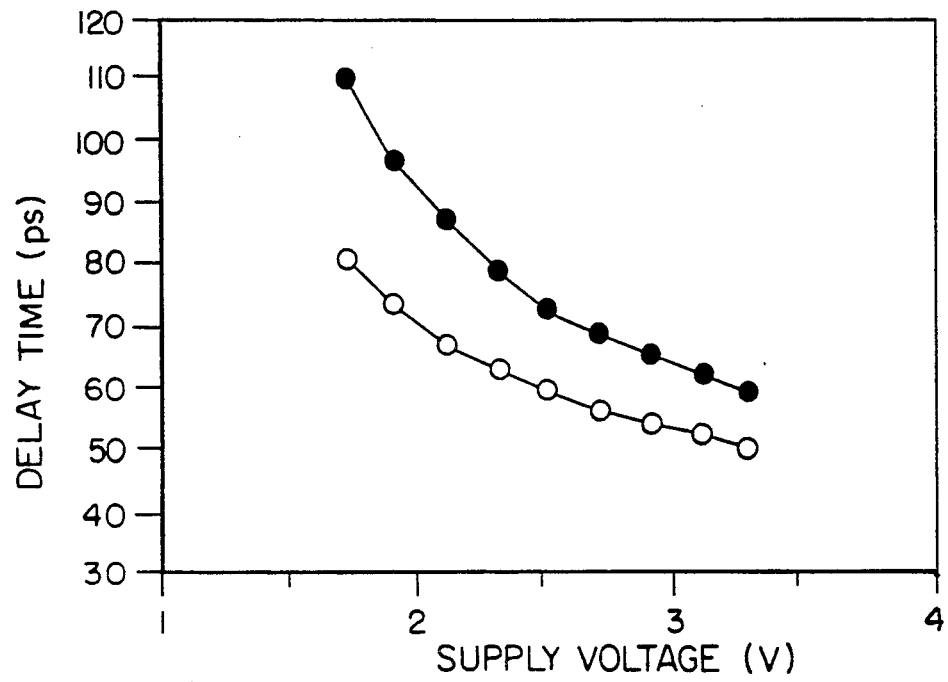
FIG. 9  —○— PRESENT INVENTION
—●— CONVENTIONAL
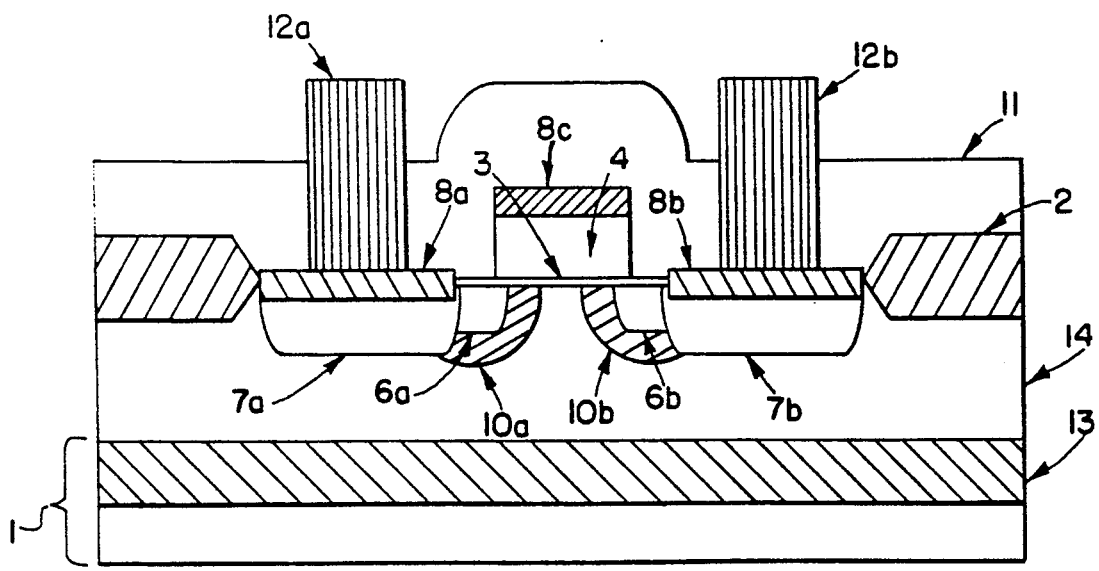
FIG. 10

METHOD FOR MAKING SEMICONDUCTOR TRANSISTOR DEVICE BY IMPLANTING PUNCH THROUGH STOPPERS

This is a division, of application Ser. No. 07/919,202, now abandoned, filed Jul. 23, 1992.

BACKGROUND OF THE INVENTION

1. Field of the Invention

The present invention relates to a semiconductor transistor device with a high packing density and a method for producing a miniaturized semiconductor transistor device capable of high speed operation.

2. Description of the Prior Art

A semiconductor transistor device having a high packing density such as an LSI has recently been developed to have a smaller element size. Such a development has brought problems such as the decreasing of a withstand voltage of transistors and an instability of an inversion threshold voltage of transistors.

Referring to the attached drawings, a production method for a conventional metal-oxide-semiconductor type field effect transistor (MOS transistor) will now be described. FIGS. 14A through 14D show an example of the production method of a conventional n-channel type MOS transistor.

As is shown in FIG. 14A, boron ions are implanted into a p-type semiconductor substrate 1 to form a p$^+$-type semiconductor region 10, which is then oxidized to form a gate insulating film 3 with a thickness of 8 to 12 nm.

After depositing a polysilicon film with a thickness of 200 to 300 nm on a top surface of the gate insulating film 3, a polysilicon gate electrode 4 is formed through ordinary photolithography and etching processes as is shown in FIG. 14B. Next, phosphorus ions are implanted into the substrate 1 by an ion implantation using the gate electrode 4 as a mask, thereby forming n$^-$-type semiconductor regions (LDD regions) 6a and 6b as part of a source region and part of a drain region, respectively.

A silicon oxide film is deposited on the top surface of the patterned substrate 1, and then main portions of the deposited film are removed by an anisotropic dry etching so as to allow side wall spacers 5a and 5b to remain on side walls of the gate electrode 4 as is shown in FIG. 14C. Then arsenic ions are implanted by the ion implantation using the gate electrode 4 and the side wall spacers 5a and 5b as a mask, thereby forming n$^+$-type semiconductor regions 7a and 7b, which are parts of the source region and the drain region, respectively. Next, the substrate 1 is heat treated at 900° C. for 30 minutes in order to activate the arsenic ions in the n$^+$-type source and drain regions 7a and 7b and repair crystal defects (lattice damages).

An interlevel insulating film 11 is deposited in an ordinary manner as is shown in FIG. 14D. After etching contact portions in the interlevel insulating film 11 to form contact holes, metal electrodes 12a and 12b are formed to contact with the n$^+$-type source and regions 7a and 7b.

An operation of the n-channel type MOS transistor with the above-mentioned structure will now be described. The p+-type semiconductor region 10 serves to prevent a punch through effect, that is, an effect in which a drain depletion layer of the transistor is extended and the withstand voltage is decreased. In addition, an impurity concentration of the p$^+$-type semiconductor region 10 determines the inversion threshold voltage of the MOS transistor. The n$^-$-type LDD regions 6a and 6b serve to decrease the strength of electric fields near the source and drain regions so as to prevent the MOS transistor from degrading due to a hot carrier injection.

Alternatively, a similar result can be attained by increasing an impurity concentration of the p-type semiconductor substrate 1 or using a p-type well with a high impurity concentration instead of forming the p$^+$-type semiconductor region 10 in the device of FIGS. 14A through 14D. However, in such a device having an increased p-type impurity concentration, there are some problems to prevent attaining a miniaturization and a high speed operation of the MOS transistor.

The conventional MOS transistor, in which the p$^+$-type semiconductor region 10 controls the inversion threshold voltage and increases a voltage at which the punch through is caused (hereinafter called the "punch through withstand voltage") has the following problems:

1. The junction capacitance is increased due to a high impurity concentration near pn-junctions of the source region and the drain region. Such a large junction capacitance makes it difficult to operate a circuit at a high speed.

2. When the impurity concentration of the p$^+$-type semiconductor region 10 is increased to prevent the punch through, the inversion threshold voltage is inevitably increased and the drivability (transconductance) of the MOS transistor is decreased. In other words, it is difficult to get satisfactory values for all of the punch through withstand voltage, the inversion threshold voltage and the drivability.

3. A substrate bias effect in which the electrical characteristic of the MOS transistor depends upon an electrical potential of the substrate 1 is reinforced by the existence of the p$^+$-type semiconductor region 10.

4. Since a heat treatment at a high temperature such as 900° C. or more must be conducted in order to activate the impurities after forming the n$^+$-type source and drain regions, a short channel effect is reinforced because the n$^-$-type LDD region is diffused and an effective channel length of the transistor is decreased.

SUMMARY OF THE INVENTION

The semiconductor transistor device of this invention comprises a semiconductor substrate of a first conductivity type, a gate insulating film formed on the semiconductor substrate, a gate electrode formed on the gate insulating film, a source region and a drain region of a second conductivity type formed in the semiconductor substrate, a channel region formed directly under the gate electrode between the source region and the drain region, and a pair of punch through stoppers of the first conductivity type formed in end portions of the channel region, and one of the pair of the punch through stoppers adjoins the source region and the other of the pair of the punch through stoppers adjoins the drain region.

Alternatively, the present invention provides a method for producing a semiconductor transistor device comprising the steps of forming a first insulating film as a gate insulating film on a semiconductor substrate of a first conductivity type, forming a first conductive film as a gate electrode in the shape of wiring on the first insulating film, implanting impurities of a second conductivity type into the semiconductor substrate by a first ion implantation using the first conductive film as a mask, so as to form first semiconductor regions of the second conductivity type, forming a second insulating film on each side wall of the first conductive film and removing portions of the first insulating film so as to expose a surface of the semiconductor substrate thereunder, depositing a metal on the exposed surface of the semiconductor substrate and a top surface of the first conductive film, forming a metal compound by allowing the metal to react with the semiconductor substrate and the first conductive film by a heat treatment, removing unreacted portions of the metal on the second insulating film, removing the second insulating film, and implanting impurities of the first conductivity type into the semiconductor substrate by a second ion implantation using the metal compound and the first conductive film as a mask, so as to form second semiconductor regions of the first conductivity type in the semiconductor substrate, and the second semiconductor regions control an inversion threshold voltage of the device and prevent a punch through between the source region and the drain region.

Alternatively, the present invention provides a method for producing a semiconductor transistor device comprising the steps of forming a first insulating film as a gate insulating film on a semiconductor substrate of a first conductivity type, forming a first conductive film as a gate electrode in the shape of wiring on the first insulating film, forming a second insulating film on each side wall of the first conductive film and removing portions of the first insulating film so as to expose a surface of the semiconductor substrate thereunder, depositing a metal on the exposed surface of the semiconductor substrate and a top surface of the first conductive film, forming a metal compound by allowing the metal to react with the semiconductor substrate and the first conductive film by a heat treatment, removing unreacted portions of the metal on the second insulating film, implanting impurities of a second conductivity type into the semiconductor substrate by a first ion implantation using the first conductive film as a mask, so as to form first semiconductor regions of the second conductivity type, removing the second insulating film, and implanting impurities of the first conductivity type into the semiconductor substrate by a second ion implantation using the metal compound and the first conductive film as a mask, so as to form second semiconductor regions of the first conductivity type in the semiconductor substrate, and the second semiconductor regions control an inversion threshold voltage of the device and prevent a punch through between the source region and the drain region.

Alternatively, the present invention provides a method for producing a semiconductor transistor device comprising the steps of forming a first insulating film as a gate insulating film on a semiconductor substrate of a first conductivity type, forming a first conductive film as a gate electrode in the shape of wiring on the first insulating film, implanting impurities of a second conductivity type into the semiconductor substrate by a first ion implantation using the first conductive film as a mask so as to form first semiconductor regions of the second conductivity type, forming a second insulating film on each side wall of the first conductive film and removing portions of the first insulating film so as to expose a surface of the semiconductor substrate thereunder, forming a second conductive film on the exposed surface of the semiconductor substrate, removing the second insulating film, and implanting impurities of the first conductivity type into the semiconductor substrate by a second ion implantation using the first conductive film and the second conductive film as a mask, so as to form second semiconductor regions of the first conductivity type in the semiconductor substrate, and the second semiconductor regions serve to control an inversion threshold voltage of the semiconductor transistor device and prevent a punch through.

Alternatively, the present invention provides a method for producing a semiconductor transistor device comprising the steps of forming a first insulating film as a gate insulating film on a semiconductor substrate of a first conductivity type, forming a first conductive film as a gate electrode in the shape of wiring on the first insulating film, forming a second insulating film on each side wall of the first conductive film, forming a first semiconductor region of a second conductivity type in the semiconductor substrate by a first ion implantation using the first conductive film and the second insulating film as a mask, removing the first insulating film so as to expose a surface of the semiconductor substrate thereunder, depositing a metal on the exposed surface of the semiconductor device a top surface of the first conductive film, forming a metal compound by allowing the metal to react with the semiconductor substrate and the first conductive film by a heat treatment, removing unreacted portions of the metal on the second insulating film, removing the second insulating film, implanting impurities of the first conductivity type into the semiconductor substrate by a second ion implantation using the metal compound and the first conductive film as a mask, so as to form second semiconductor regions of the first conductivity type in the semiconductor substrate, and implanting impurities of the second conductivity type into the semiconductor substrate by a third ion implantation using the metal compound and the first conductive film as a mask, so as to form a third semiconductor region of the second conductivity type as a part of the source region or the drain region in the semiconductor substrate, and an inversion threshold voltage is controlled by the second semiconductor regions, thereby preventing a punch through, the first semiconductor region has a higher impurity concentration than that of the third semiconductor region.

Alternatively, the present invention provides a method for producing a semiconductor transistor device comprising the steps of forming a first insulating film as a gate insulating film on a semiconductor substrate of a first conductivity type, forming a first conductive film as a gate electrode in the shape of wiring on the first insulating film, implanting impurities of the first conductivity type into the semiconductor substrate by a first tilt ion implantation using the first conductive film as a mask so as to form first semiconductor regions of the first conductivity type, implanting impurities of a second conductivity type into the semiconductor substrate by a second ion implantation using the first conductive film as a mask so as to form second semiconductor regions of the second conductivity type, forming a second insulating film on each side wall of the first conductive film, and implanting impurities of the second conductivity type into the semiconductor substrate by a third ion implantation using the second conductive film and the second insulating film as a mask so as to form third semiconductor regions of the second conductivity and the first semiconductor regions are thinner than the second and the third semiconductor regions, and each of the first semiconductor regions is formed by the side of each of the second semiconductor regions.

Thus, the invention described herein makes possible the advantages of (1) providing a semiconductor transistor device with a high withstand voltage and a high drivability in which an inversion threshold voltage is controlled without increasing a parasitic junction capacitance, (2) providing a semiconductor transistor device in which an impurity concentration near pn-junctions of source and drain regions is low and a parasitic junction capacitance is decreased to improve an operation speed of a circuit, (3) providing a semiconductor transistor device in which a parasitic effect such as a latch-up is completely avoided by sufficiently decreasing a resistance of a substrate in a high impurity concentration semiconductor region, and (4) providing a semiconductor transistor device in which a short channel effect is prevented.

These and other advantages of the present invention will become apparent to those skilled in the art upon reading and understanding the following detailed description with reference to the accompanying figures.

BRIEF DESCRIPTION OF THE DRAWINGS

FIG. 9 is a graph showing a relationship between a supply voltage and a delay time of a CMOS ring oscillator in the example;

FIG. 10 is a sectional view of a MOS transistor of a second example according to the present invention;

DESCRIPTION OF THE PREFERRED EMBODIMENTS

EXAMPLE 1

Referring to FIGS. 1A through 1D, a first example of a production method for a semiconductor transistor device according to the present invention will now be described.

Figure 1A:
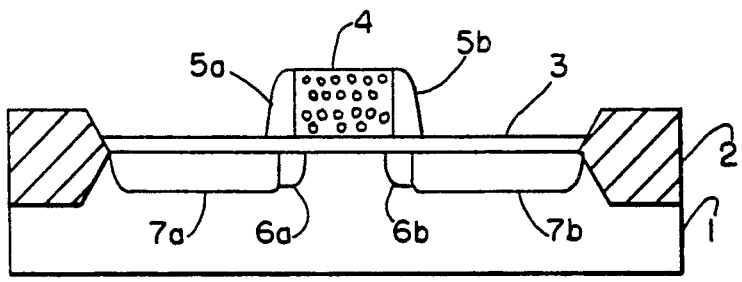
FIGS. 1A through 1D are sectional views showing a production process of a MOS transistor in a first example of the present invention.

As is shown in FIG. 1A, a silicon oxide film 2 with a thickness of about 400 nm as an insulating film for separating elements is formed on an element separation region of a p-type single crystal silicon semiconductor substrate 1. Another silicon oxide film 3 with a thickness of 8 to 12 nm as a gate insulating film is formed on an active region of the substrate 1. Then, after depositing a polycrystalline silicon film with a thickness of 250 to 300 nm on these silicon oxide films 2 and 3, a gate electrode 4 is formed by etching the deposited polycrystalline silicon film in ordinary photolithography and etching processes. Next, phosphorus ions are implanted at a dose of 1 to $4 \times 10^{13}$ cm$^{-2}$ at 40 keV using the gate electrode 4 as a mask, thereby forming an n$^-$-type source (LDD) region 6a and an n$^-$-type drain region 6b. A silicon nitride film with a thickness of 150 to 250 nm is then deposited on a top surface of the patterned substrate 1. Through an ordinary etch back, side wall spacers 5a and 5b made of the silicon nitride film are formed, and exposed portions of the silicon oxide film 3 on the silicon substrate 1 are removed so as to expose the silicon substrate 1 thereunder. Then, arsenic ions are implanted into the substrate 1 at a dose of 4 to $6 \times 10^{14}$ cm$^{-2}$ at 40 keV using the gate electrode 4 and the side wall spacers 5a and 5b as a mask, thereby forming an n$^+$-type source region 7a and an n$^+$-type drain region 7b.

Figure 1B:
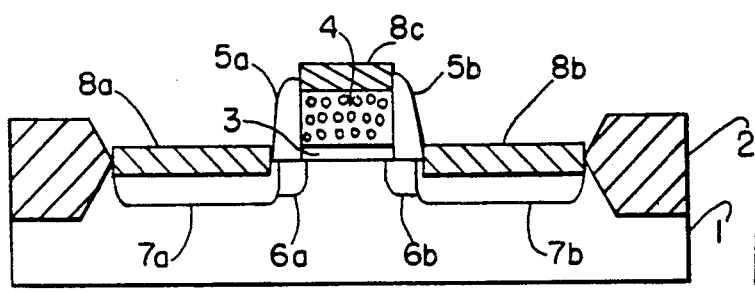

As is shown in FIG. 1B, after depositing a titanium film with a thickness of 40 to 60 nm on the top surface of the substrate 1 patterned as shown in FIG. 1A, a heat treatment at a temperature of 600° to 850° C. is conducted to allow the titanium film to react with the silicon substrate 1 and the polycrystalline silicon gate electrode 4, thereby forming titanium silicide films 8a, 8b and 8c with a thickness of 60 to 100 nm, respectively. At this step, since the titanium film does not react with the silicon nitride film, the titanium films on the side wall spacers 5a and 5b remain unreacted. Then, the unreacted titanium films are selectively removed by a wet etching using sulfuric acid.

Figure 1C:
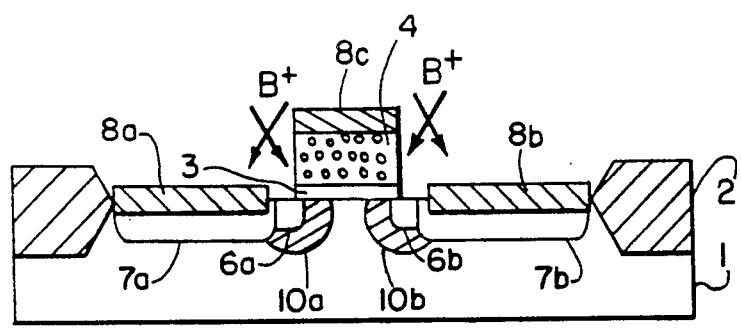

As is shown in FIG. 1C, the side wall spacers 5a and 5b made of the silicon nitride film are selectively removed by a dry etching using an etching gas such as CH$_2$F$_2$ and NF$_3$. Then, boron ions are implanted at a dose of 2 to $10 \times 10^{12}$ cm$^{-2}$ at 30 to 50 keV using the gate electrode 4 and the titanium silicide films 8a and 8b on the source and drain regions as a mask. The adopted implantation method is a rotating implantation or a step ion implantation in which ions are implanted into a substrate at such a large angle (an angle of ion beams to a normal line of a main surface of the substrate 1) as 20 to 60 degrees, preferably 25 to 45 degrees (hereinafter called the "tilt ion implantation"). Thus p$^+$-type semiconductor regions 10a and 10b are formed as punch through stoppers. Since the ion stopping power of titanium silicide is about 1.5 times higher than that of silicon, the boron ions are not allowed to permeate near pn-junctions between the n$^+$-type source and drain regions 7a and 7b and the substrate 1. Therefore, it is easy to form the p+-type semiconductor regions 10a and 10b only in a channel region.

The condition of the ion implantation for forming the p+-type semiconductor regions 10a and 10b may be adjusted depending upon various factors such as an impurity concentration of the substrate 1, a desired value of the inversion threshold voltage, a minimum gate length and a drain structure. A dosage and a tilt angle of the ion implantation can be selected from a wide range. Boron fluoride ions ($BF_2^+$) and indium ions are appropriate besides boron ions.

Figure 2A:
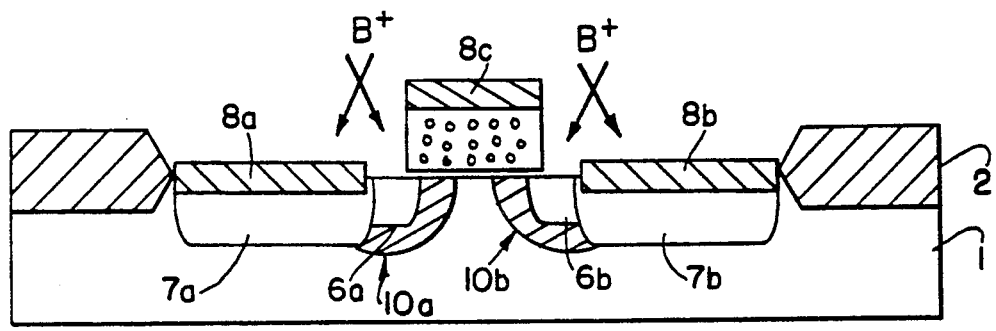
FIGS. 2A through 2C are enlarged sectional views of a drain structure of the MOS transistor of the example.
Figure 2B:
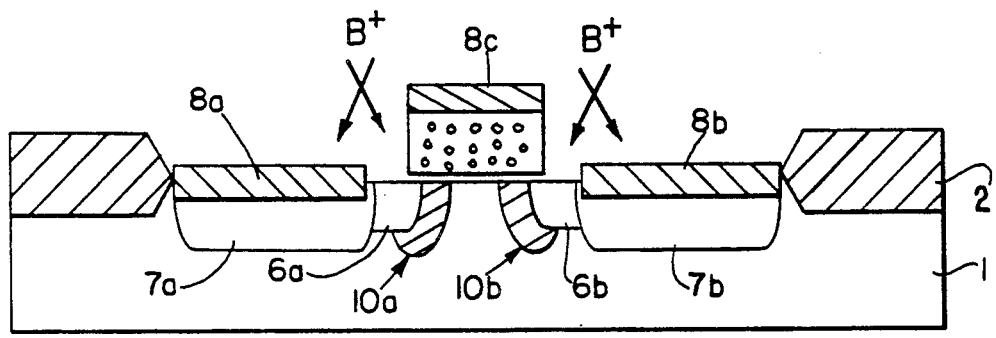
Figure 2C:
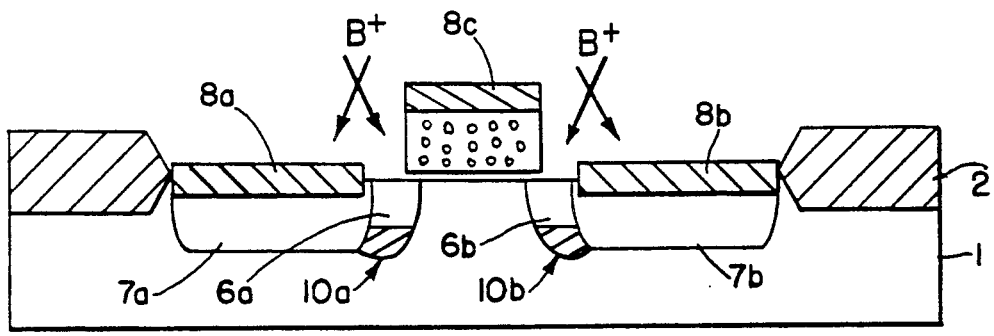

FIGS. 2A through 2C are enlarged sectional views of different drain structures. In FIG. 2A, the p+-type semiconductor regions 10a and 10b completely cover interfaces (pn-junctions) between the n⁻-type LDD regions 6a and 6b and the p-type substrate 1. In FIG. 2B, the p+-type semiconductor regions 10a and 10b are on the inner sides (the sides near the channel region) of the n⁻-type LDD regions 6a and 6b. In FIG. 2C, the p+-type semiconductor regions 10a and 10b are under the n⁻-type LDD regions 6a and 6b so as to prevent an n+-type drain depletion layer from extending. As described above, in any of the above structures, the p+-type semiconductor regions IOa and 10b are not formed under the n+-type source and drain regions 7a and 7b. Therefore, it is possible to obtain a high speed semiconductor transistor device with a small parasitic junction capacitance and a low impurity concentration in the center of the channel region.

Figure 1D:
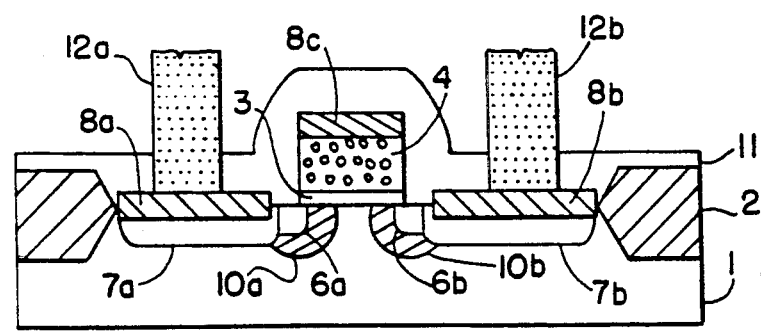

As is shown in FIG. 1D, an interlevel insulating film 11 is deposited in an ordinary manner and contact holes reaching the titanium silicide films 8a and 8b are formed in the interlevel insulating film 11. Aluminum electrodes 12a and 12b are then formed in contact with the titanium silicide films 8a and 8b. A p-channel type MOS transistor can be produced in the same manner as above when the conductivity type of each region is reversed.

Figure 3:
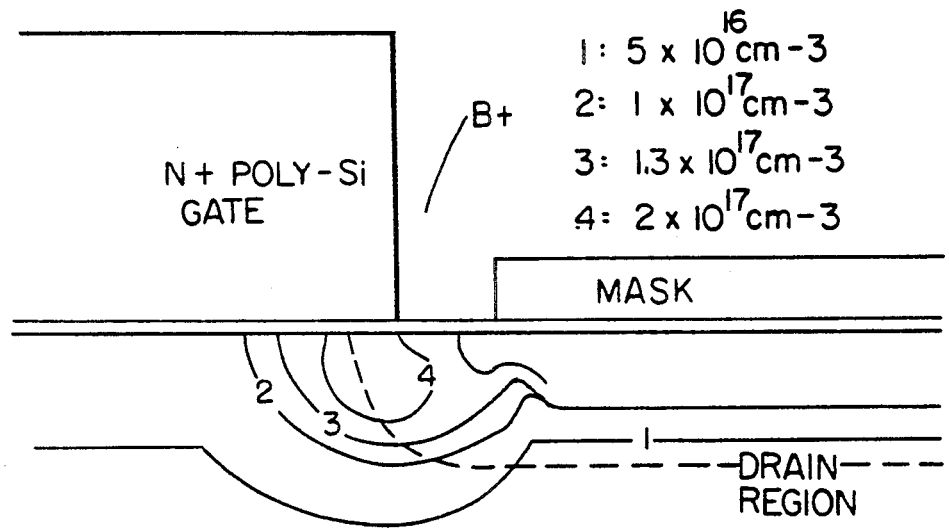
FIG. 3 is a two dimensional profile near a drain region of an n-channel type MOS transistor of the example.
Figure 4:
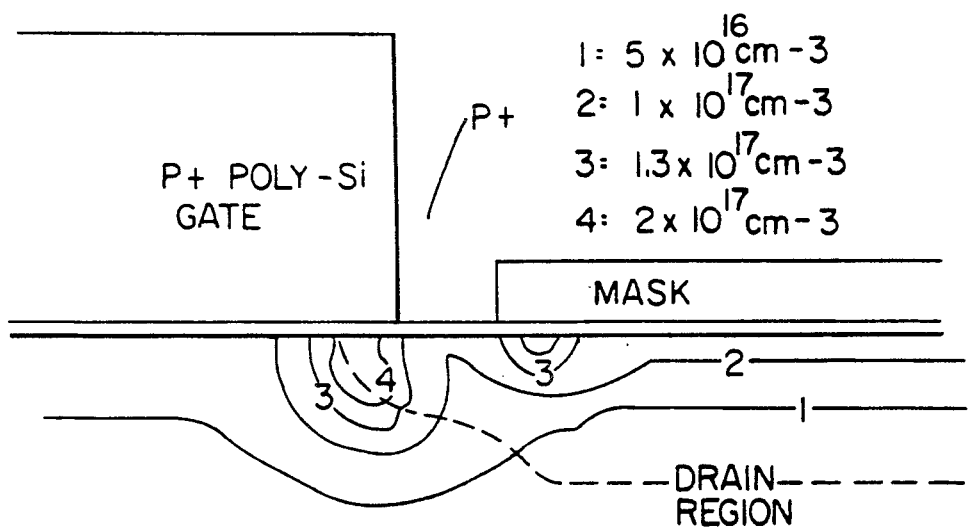
FIG. 4 is a two dimensional profile near the drain region of a p-channel type MOS transistor of the example.

Structures of the substrate 1 and the n+-type drain region 7b of the transistor according to this example will now be described in detail referring to the drawings. FIG. 3 shows a computer simulation result of a two dimensional impurity profile near the drain region of the n-channel type MOS transistor, that is, a calculated profile of the concentration of boron ions. In the simulation using a computer, an implant mask of an $SiO_2$ film is used instead of a $TiSi_2$ film. As is shown in FIG. 3, the boron ions are implanted only into a portion of the drain region near the channel region (hereinafter called the "channel side") and do not affect the impurity concentration near the junction of the drain region. FIG. 4 shows a result of the simulation on a p-channel type (a surface channel type) transistor, that is, a calculated profile of the concentration of phosphorus ions. As is in FIG. 3, the phosphorus ions are selectively implanted into an edge portion on the channel side of the drain region.

Electric characteristics of a CMOS transistor produced as a sample in the production method of this example will now be described. The produced sample is a surface channel type using a p+-type polysilicon as a gate electrode of the p-channel type transistor, and is called a dual gate type CMOS transistor since an n+-type polysilicon is used as a gate electrode of the n-channel type transistor.

Figure 5:
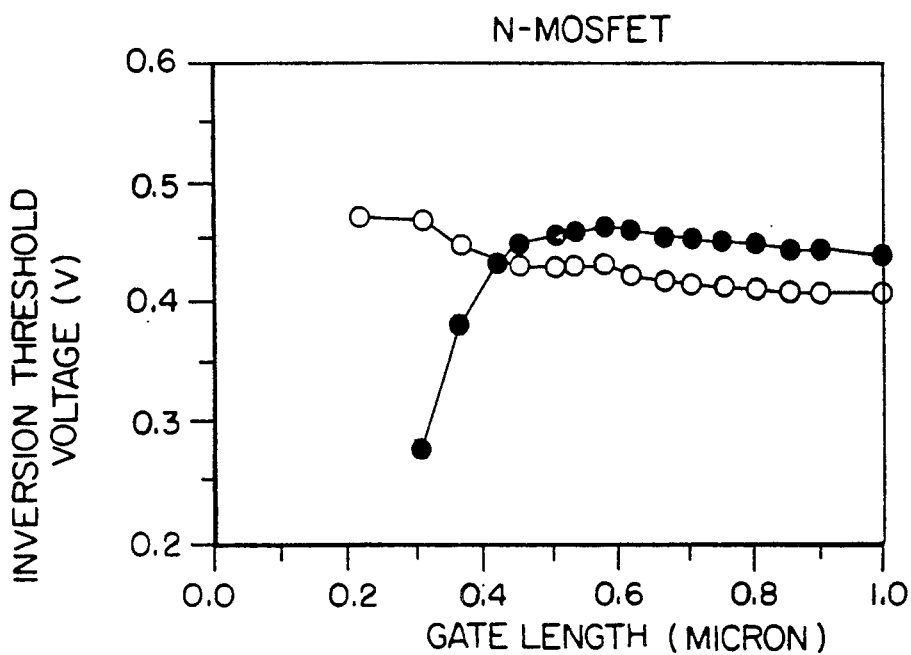
FIG. 5 is a graph showing a short channel effect of the n-channel type MOS transistor of the example.
Figure 6:
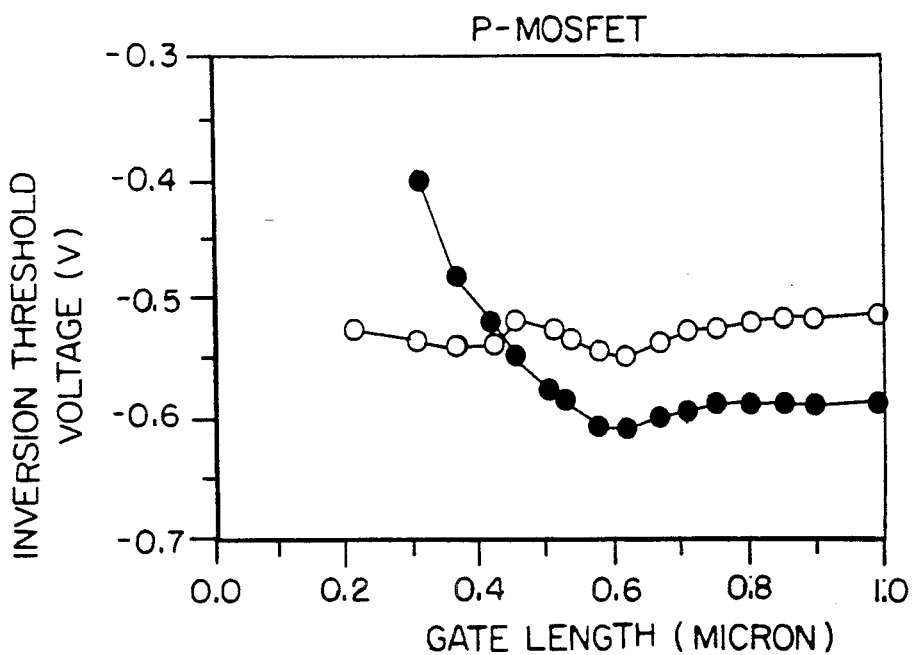
FIG. 6 is a graph showing the short channel effect of the p-channel type MOS transistor of the example.

FIGS. 5 and 6 are graphs showing a short channel effect of the n-channel type MOS transistor and the p-channel type MOS transistor, respectively. As to samples according to the conventional method, the absolute value of the inversion threshold voltage is decreased when a gate length Lg is less than about 0.5 micron. However, the sample according to this example keeps the inversion threshold voltage even when the gate length Lg is 0.2 micron in both the n-channel type and p-channel type transistors. This is because the drain depletion layer is prevented from extending by the p+-type semiconductor regions 10a and 10b formed by the boron ion implantation in the n-channel type transistor and by n+-type semiconductor regions formed by the phosphorus ion implantation in the p-channel type transistor. When the gate length Lg is small, the p+-type or n+-type semiconductor regions on both sides of the channel get closer to each other to effectively increase the impurity concentration of the channel region. This is the reason the absolute value of the inversion threshold voltage is slightly increased when the gate length Lg is below 0.4 micron in FIGS. 5 and 6.

Figure 7:
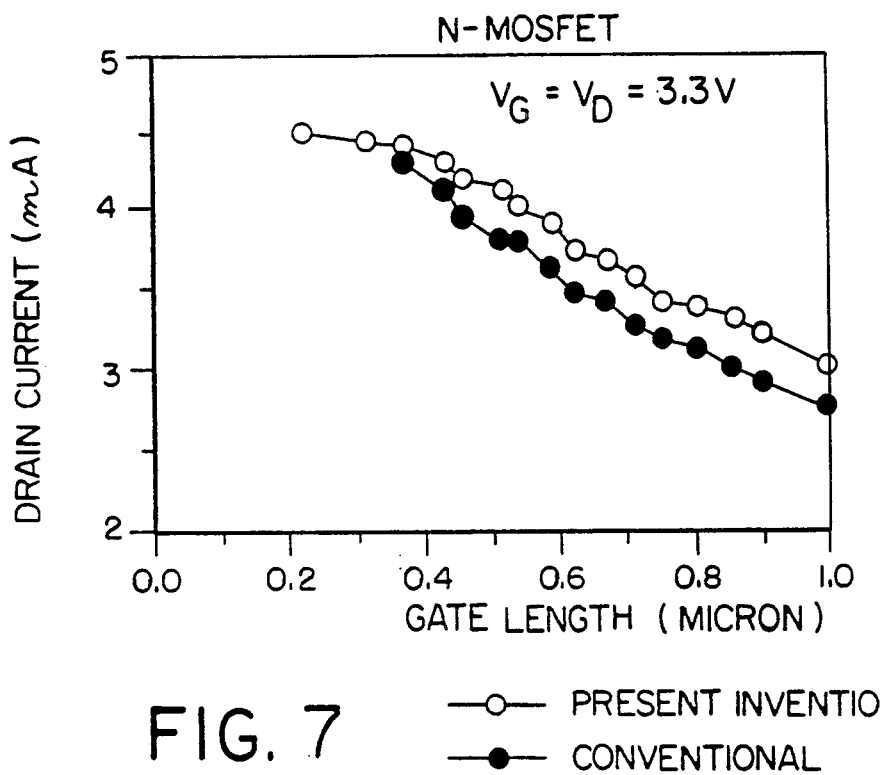
FIG. 7 is a graph showing a relationship between a gate length and a drain current of the n-channel type MOS transistor of the example.
Figure 8:
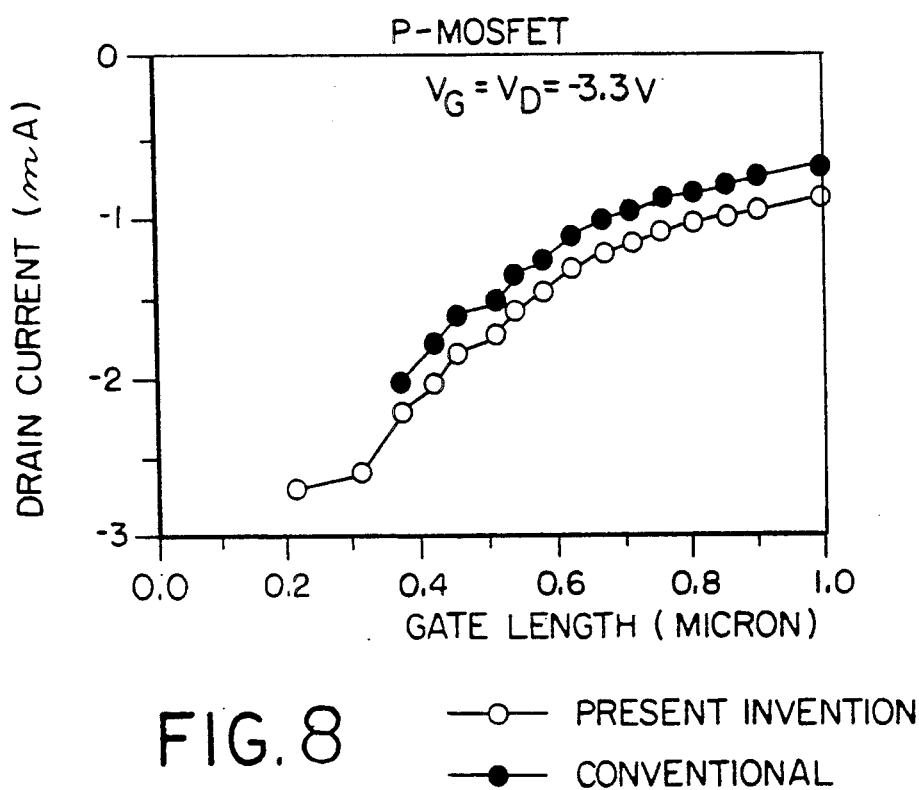
FIG. 8 is a graph showing a relationship between a gate length and a drain current of the p-channel type MOS transistor of the example.

FIGS. 7 and 8 show a relationship between a drain saturation current and the gate length Lg. These figures show that the sample according to this example of the invention has a larger current value by 8 to 20% than the one according to the conventional method. This is because the impurity concentration in the center of the channel region is low and a carrier mobility is larger in the sample of this example.

FIG. 9 shows a relationship between a delay time per one gate of a CMOS ring oscillator and a supply voltage. The sample of this example operates faster than the one of the conventional by about 20%. This is because the drain (junction) capacitance is smaller and the drain current is larger in the sample of this example. The drain capacitance of the n-channel transistor of this example is 0.88 fF/$\mu m^2$ and that of the conventional one is 1.26 fF/$\mu m^2$ (a calculated value).

As described above, in the structure of the semiconductor transistor device as shown in FIG. 1D, the p+-type semiconductor regions 10a and 10b as p+-type punch through stoppers are formed under the channel region and the n⁻-type LDD regions 6a and 6b, therefore, the impurity concentration of the channel region varies in the lateral direction. Moreover, since the inversion threshold voltage mainly depends upon the impurity concentration of the end of the source region, the impurity concentration in the center of the channel region can be settled so low and the carrier mobility is so high that the drivability of the transistor is large. The most appropriate concentration of the p+-type semiconductor regions 10a and 10b can be selected depending upon a predetermined value of the inversion threshold voltage, an impurity concentration of the substrate 1 and a gate length. Moreover, a junction depth of the p+-type semiconductor regions 10a and 10b is larger than a junction depth Xj of the n+-type source and drain regions 7a and 7b and is effective to prevent a punch through between the source and the drain regions 7a and 7b. Further, since the p+-type semiconductor regions 10a and 10b are not formed under the n+-type source and drain regions 7a and 7b, the parasitic junction capacitance is small and the circuit operation speed is high.

According to the production method of this example, the impurity concentration of the p-type semiconductor substrate 1 (or a p-type well) can be settled low and the p+-type semiconductor region is selectively formed, and the short channel effect can be prevented without increasing the drain capacitance. Moreover, due to the low impurity concentration in the center of the channel region, a MOS transistor with a large drain current can be produced.

The electrode can be formed in almost the same manner as described above using a refractory metal with a high melting point such as cobalt and tungsten instead of titanium. Any material with a high etching selectivity to a metal silicide film or a silicon oxide film can be used as the side wall spacer, and titanium nitride and the like are appropriate as well as silicon nitride.

It is comparatively easy to form the p+-type semiconductor regions 10a and 10b separately when a width of the gate electrode, that is, the gate length Lg of the MOS transistor, is about 0.3 micron or more. However, the p+-type semiconductor regions 10a and 10b may be in contact with each other when the gate length Lg is less than 0.3 micron, a so-called ¼ micron region. Even in this case, the impurity profile under the channel region is not uniform, which is considerably different from the conventional transistor shown in FIGS. 14A through 14D. In other words, even the transistor with a small gate length Lg has the same advantage that the drivability is larger and the drain capacitance is smaller than the conventional transistor with a large gate length Lg.

In the above example, silicidation is conducted after forming the source and drain regions. However, the source and drain regions can be formed after the silicidation. In this case, an acceleration energy needs to be high since the impurities are implanted through the silicide film. For example, in the n-channel type transistor, the implantation of arsenic ions at 80 keV is appropriate. The ion implantation dosage is the same as that in implanting before the silicidation.

EXAMPLE 2

Referring to FIG. 10, a second example of the production method for a semiconductor transistor device according to the present invention will now be described. As is shown in FIG. 10, after forming a p-type semiconductor region 13 directly in a surface region of a p-type single crystal silicon substrate 1, a p-type single crystal silicon film 14 is epitaxially grown thereon. Then, an n-channel type transistor is formed in the p-type single crystal silicon film 14 in the same manner as in Example 1.

In a CMOS device having a well with a low impurity concentration, there are considerable possibilities that an npn-type parasitic bipolar transistor works, that is, a so-called latch-up phenomenon is caused. The latch-up is one of the main factors to prevent a miniaturization of the transistor, as a small distance between the n-channel type transistor and the p-channel type transistor in the CMOS device makes a drivability of the parasitic bipolar transistor large. Generally, the latch-up is prevented by reducing a resistance of the well by increasing the impurity concentration of the well. However, as described above, a high impurity concentration of the well increases the junction capacitance, thereby degrading the circuit operation.

In this example, the electrical resistance of the well (the p-type single crystal silicon film 14) is sufficiently reduced by using the p-type semiconductor region 13 with a high impurity concentration. Thus, a parasitic effect such as the latch-up can be completely avoided. The impurity concentration of the p-type single crystal silicon film 14 can be very small, thereby drastically decreasing the parasitic drain junction capacitance. Moreover, since the impurity concentration in the center of the channel region of the transistor is very low, the drivability can be increased.

EXAMPLE 3

Referring to FIGS. 11A through 11D, a third example of the production method of a semiconductor transistor device according to the present invention will now be described.

Figure 11A:
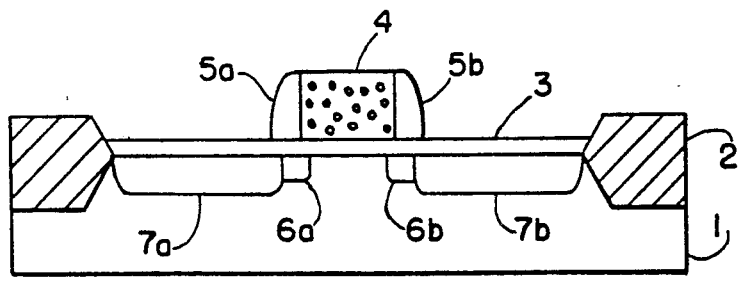
FIGS. 11A through 11D are sectional views showing a production process of a MOS transistor of a third example of the present invention.

As is shown in FIG. 11A, a silicon oxide film 2 with a thickness of about 400 nm as an insulating film for separating elements is formed on an element separation region of a p-type single crystal silicon semiconductor substrate 1. Another silicon oxide film 3 with a thickness of 8 to 12 nm as a gate insulating film is formed on an active region of the substrate 1. Then, after depositing a polycrystalline silicon film with a thickness of 250 to 300 nm on these silicon oxide film 2 and the gate insulating film 3, a gate electrode 4 is formed by etching the deposited polycrystalline silicon film by ordinary photolithography and etching processes. Next, phosphorus ions are implanted at a dose of 1 to $4 \times 10^{13}$ cm$^{-2}$ at 40 keV using the gate electrode 4 as a mask, thereby forming an n$^-$-type source (LDD) region 6a and an n$^-$-type drain (LDD) region 6b. A silicon nitride film with a thickness of 150 to 250 nm is then deposited on a top surface of the patterned substrate 1. Through an ordinary etch back, side wall spacers 5a and 5b made of the silicon nitride film are formed. Then, arsenic ions are implanted into the patterned silicon semiconductor substrate 1 at a dose of 4 to $6 \times 10^{14}$ cm$^{-2}$ at 80 keV using the gate electrode 4 and the side wall spacers 5a and 5b as a mask, thereby forming an n+-type source region 7a and an n+-type drain region 7b.

Figure 11B:
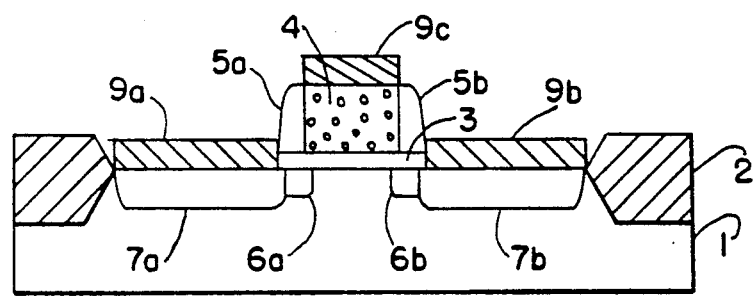

As is shown in FIG. 11B, after removing the exposed portions of the oxide film 3 on the silicon substrate 1, tungsten films 9a, 9b and 9c with a thickness of 30 to 50 nm, respectively are deposited on exposed surfaces of the silicon substrate 1 and the gate electrode 4.

Figure 11C:
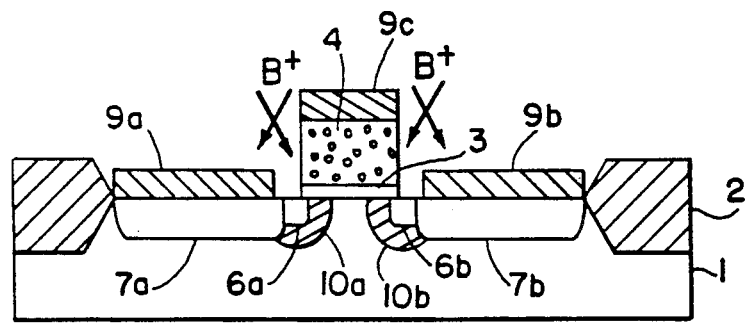

As is shown in FIG. 11C, the side wall spacers 5a and 5b made of the silicon nitride film are selectively removed by a dry etching. Then, p+-type semiconductor regions 10a and 10b as punch through stoppers are formed by implanting boron ions at a dose of 2 to $8 \times 10^{12}$ cm$^{-2}$ at 20 to 30 keV using the gate electrode 4 and the tungsten films 9a and 9b on the source and drain regions as a mask by the tilt ion implantation with an angle of 20 to 25 degrees.

Figure 11D:
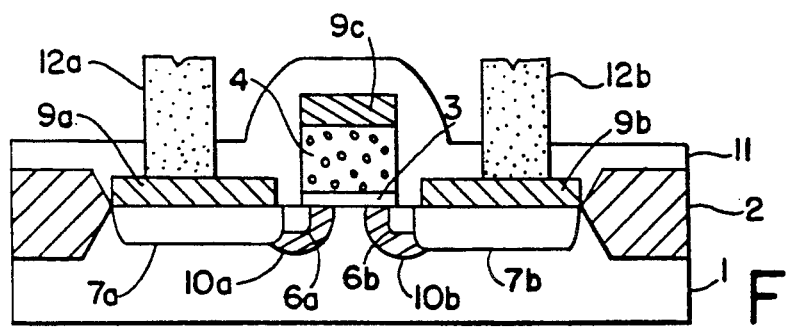

As is shown in FIG. 11D, after an interlevel insulating film 11 is deposited in an ordinary method and contact holes are formed in the interlevel insulating film 11, aluminum electrodes 12a and 12b are formed to contact the tungsten films 9a and 9b, respectively.

In this way, according to the method of this example, a MOS transistor is obtained in which the short channel effect can be avoided without increasing the drain capacitance since the p+-type semiconductor regions 10a and 10b are selectively formed at the ends of the channel region. Moreover, since the impurity concentration in the center of the channel region is low, a large drain current can be attained.

A refractory material with a high melting point such as cobalt, a single crystalline silicon or a polycrystalline silicon may be used instead of tungsten.

It goes without saying that this example can be easily applied to a p-channel type MOS transistor to provide the same advantages as that of the n-channel type transistor when the conductivity type of each region is reversed.

EXAMPLE 4

Referring to FIGS. 12A through 12D, a fourth example of the production method for a semiconductor transistor device according to the present invention will now be described.

Figure 12A:
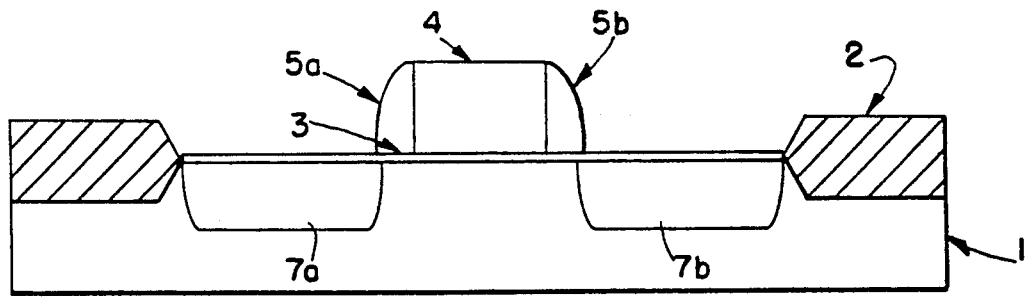
FIGS. 12A through 12D are sectional views showing a production process of a MOS transistor of a fourth example of the present invention.

As is shown in FIG. 12A, a silicon oxide film 2 with a thickness of about 400 nm as an insulating film for separating elements is formed on an element separation region of a p-type single crystal silicon semiconductor substrate 1. Another silicon oxide film 3 with a thickness of 8 to 12 nm as a gate insulating film is formed on an active region of the substrate 1. Then, after depositing a polycrystalline silicon film with a thickness of 250 to 300 nm on these silicon oxide films 2 and 3, a gate electrode 4 is formed by etching the deposited polycrystalline silicon film by ordinary photolithography and etching processes. Next, a silicon nitride film with a thickness of 150 to 250 nm is then deposited on a top surface of the patterned substrate 1. Through an ordinary etch back, side wall spacers 5a and 5b made of the silicon nitride film are formed, and exposed portions of the silicon oxide film 3 on the silicon substrate 1 are removed so as to expose the silicon substrate 1 thereunder. Then, arsenic ions are implanted into the patterned silicon semiconductor substrate 1 at a dose of 4 to $6 \times 10^{14}$ cm$^{-2}$ at 40 keV using the gate electrode 4 and the side wall spacers 5a and 5b as a mask, thereby forming an n$^+$-type source region 7a and an n$^+$-type drain region 7b. A heat treatment is conducted at a temperature of 900° C. for 30 minutes to activate the impurities and repair the crystal defects.

Figure 12B:
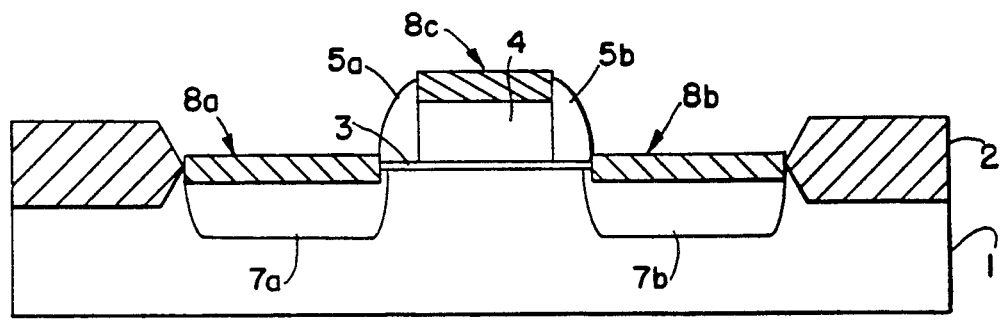

As is shown in FIG. 12B, after depositing a titanium film with a thickness of 40 to 60 nm on the top surface of the substrate 1 patterned as shown in FIG. 12A, a heat treatment is conducted at a temperature of 600° to 850° C. to allow the titanium film to react with the silicon substrate 1 and the gate electrode 4, thereby forming titanium silicide films 8a, 8b and 8c with a thickness of 60 to 100 nm, respectively. At this step, since the titanium film does not react 5 with the silicon nitride film, the titanium film on the side wall spacers 5a and 5b remain unreacted. Then, the unreacted titanium films are selectively removed by a wet etching using sulfuric acid.

Figure 12C:
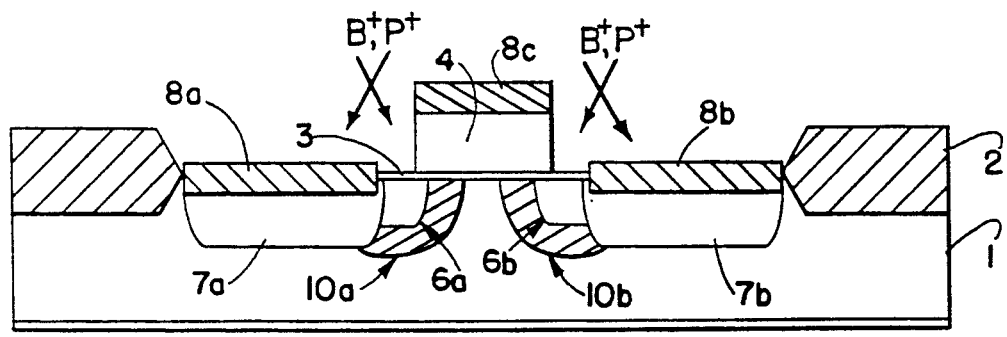

As is shown in FIG. 12C, the side wall spacers 5a and 5b made of the silicon nitride film are selectively removed by a dry etching using an etching gas such as CH$_2$F$_2$ and NF$_3$. Then, boron ions are implanted at a dose of 4 to $8 \times 10^{12}$ cm$^{-2}$ at 30 to 40 keV using the gate electrode 4 and the titanium silicide films 8a and 8b on the source and drain regions by the tilt ion implantation with an angle of 25 to 45 degrees. Thus p$^+$-type semiconductor regions 10a and 10b are formed as punch through stoppers. Since an ion stopping power of titanium silicide is about 1.5 times higher than that of silicon, boron ions are not allowed to permeate near pn-junctions between the n$^+$-type source and drain regions 7a and 7b and the substrate 1. Therefore, it is easy to form the p$^+$-type semiconductor regions only in the channel region. Then, phosphorus ions are implanted at a dose of 1 to $4 \times 10^{13}$ cm$^{-2}$ at 40 keV using the gate electrode 4 as a mask to form an n$^-$-type source region 6a and an n$^-$-type drain region 6b.

Figure 12D:
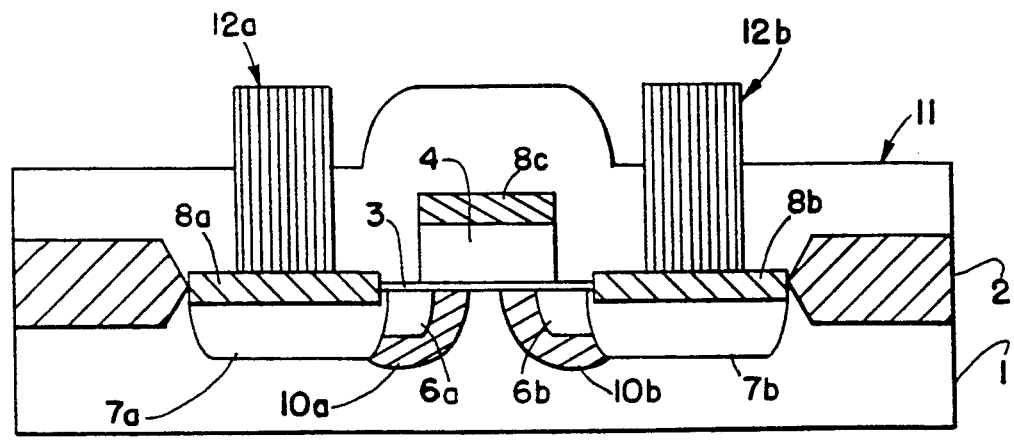

As is shown in FIG. 12D, after an interlevel insulating film 11 is deposited by an ordinary method and contact holes are formed in the interlevel insulating film 11, aluminum electrodes 12a and 12b are formed to contact the n$^+$-type source and drain regions 7a and 7b, respectively.

It goes without saying that a p-channel type MOS transistor can be produced in the same manner as described above when the conductivity type of each region is reversed. In a p-channel type transistor, the short channel effect can be improved more drastically since the p$^-$-type LDD region is formed with boron ions having a large diffusion coefficient.

EXAMPLE 5

Referring to FIGS. 13A through 13D, a fifth example of the production method of a semiconductor transistor device according to the present invention will now be described.

Figure 13A:
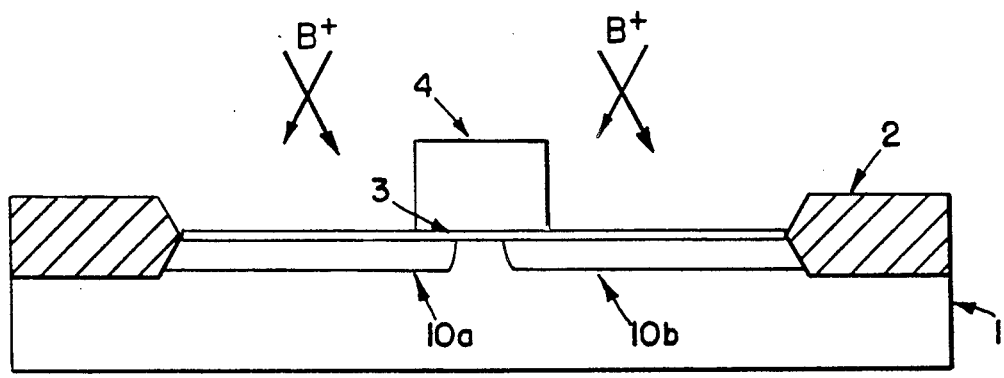
FIGS. 13A through 13D are sectional views showing a production process of a MOS transistor of a fifth example of the present invention.

As is shown in FIG. 13A, a silicon oxide film 2 with a thickness of about 400 nm as an insulating film for separating elements is formed on an element separation region of a p-type single crystal silicon semiconductor substrate 1. Another silicon oxide film 3 with a thickness of 8 to 12 nm as a gate insulating film is formed on an active region of the substrate 1. Then, after depositing a polycrystalline silicon film with a thickness of 250 to 300 nm on these silicon oxide films 2 and 3, a gate electrode 4 is formed by etching the deposited polycrystalline silicon film by ordinary photolithography and etching processes. Next, boron ions are implanted at a dose of 2 to $10 \times 10^{12}$ cm$^{-2}$ at 15 to 30 keV using the gate electrode 4 as a mask by the tilt ion implantation with an angle of 20 to 60 degrees, thereby forming p$^+$-type semiconductor regions 10a and 10b as punch through stoppers.

Figure 13B:
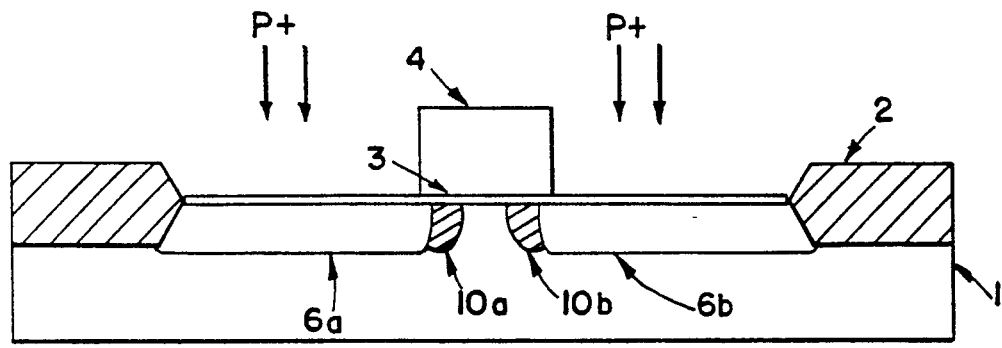

Then, as is shown in FIG. 13B, phosphorus ions are implanted at a dose of 2 to $6 \times 10^{13}$ cm$^{-2}$ at 30 to 40 keV by the ion implantation using the gate electrode 4 as a mask, thereby forming n$^-$-type LDD regions 6a and 6b.

Figure 13C:
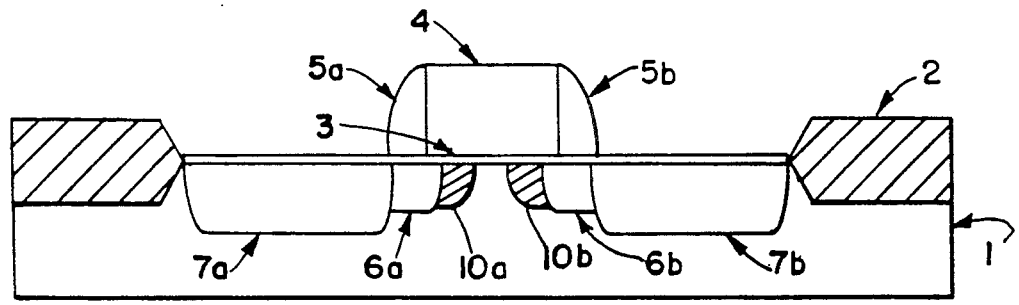

As is shown in FIG. 13C, after depositing a silicon oxide film with a thickness of 150 to 250 nm on a top surface of the patterned substrate 1, side wall spacers 5a and 5b are formed by an ordinary etch back. Then, arsenic ions are implanted at a dose of 4 to $6 \times 10^{14}$ cm$^{-2}$ at 40 keV using the gate electrode 4 and the side wall spacers 5a and 5b as a mask to form an n$^+$-type source region 7a and an n$^+$-type drain region 7b.

Figure 13D:
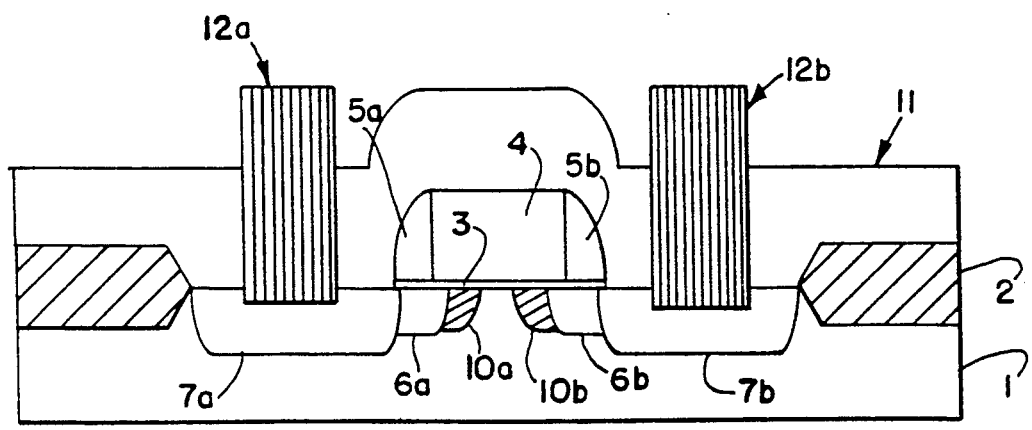
Figure 14A:
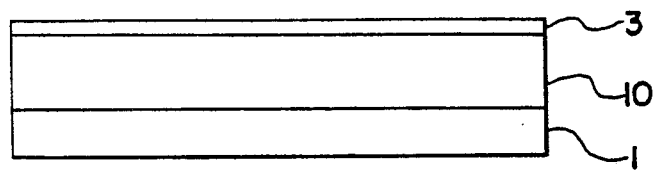
FIGS. 14A through 14D are sectional views showing a production process of a conventional MOS transistor.
Figure 14B:
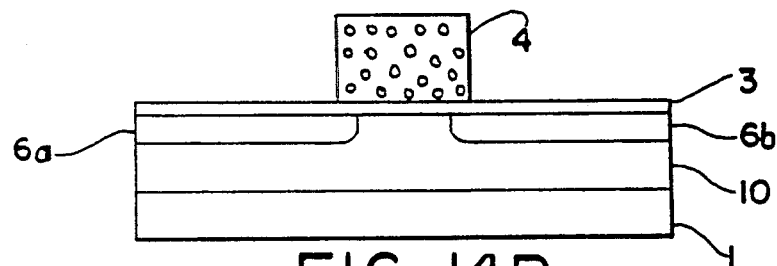
Figure 14C:
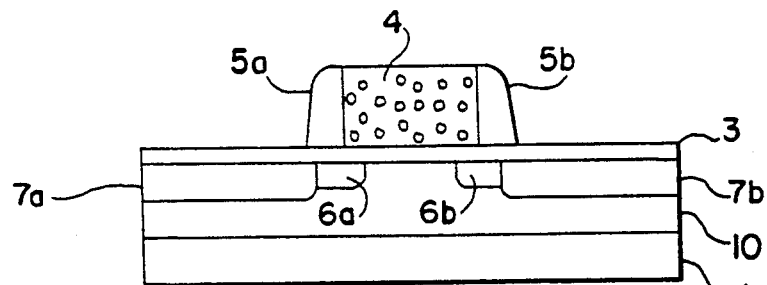
Figure 14D:
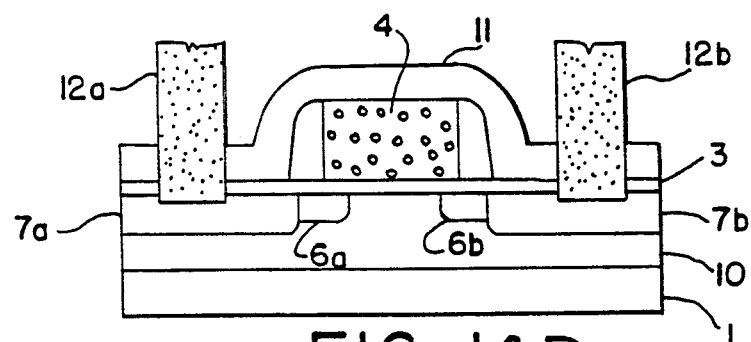

As is shown in FIG. 13D, after an interlevel insulating film 11 is deposited in an ordinary method and contact holes are formed in the interlevel insulating film 11, aluminum electrodes 12a and 12b are formed to contact the n$^+$-type source and drain regions 7a and 7b, respectively. An acceleration energy and a tilt angle of the ion implantation for forming the p$^+$-type semiconductor regions 10a and 10b are adjusted not to reach portions under the source and the drain regions 7a and 7b. Such a condition depends upon various factors such as the drain structure, the predetermined value of the inversion threshold voltage and the minimum gate length.

In accordance with this method, the MOS transistor can be miniaturized without increasing the drain capacitance because the p$^+$-type semiconductor regions 10a and 10b are formed only on the channel sides of the n$^+$-type source and drain regions 7a and 7b. In the other words, the p$^+$-type semiconductor regions 10a and 10b reach the end portions of the channel region and the impurity concentration of the channel region is laterally ununiform. The impurity concentration in the center of the channel region can be settled low. As a result, a transistor with a high carrier mobility and a large drivability is provided.

It goes without saying that a p-channel type MOS transistor can be produced in the same manner as above when the conductivity type of each region is reversed. In the p-channel type MOS transistor, the short channel effect can be further improved because the p-type LDD region is formed with boron ions with a large diffusion coefficient.

As described above, according to the device of the invention, the impurity concentration in the center of the channel region can be kept low by providing the punch through stoppers in end portions of the channel region so as to be adjacent to the source and drain regions, thereby increasing the drivability of the transistor. Moreover, since the punch through stopper is not formed under the source and drain regions, the impurity concentration near the junctions of the source and the drain regions is decreased. Therefore, the parasitic junction capacitance is decreased and the operating speed of the circuit is increased.

In the device of Example 2, the semiconductor substrate of the first conductivity type comprises a high impurity concentration semiconductor region and a low impurity concentration semiconductor region. The source and drain regions, the channel region and the punch through stoppers are formed in the low concentration semiconductor region. In this device, the resistance of the substrate can be sufficiently decreased by the high impurity concentration semiconductor region. As a result, a parasitic effect such as latch-up can be completely prevented and the impurity concentration of the low concentration semiconductor region can be very low so as to drastically decrease the parasitic junction capacitance.

According to the methods of Examples 1 through 4, after the second insulating films (the side wall spacers) formed on the side walls of the first conductive film (the gate electrode) are selectively removed, the ions are implanted only into the end portions of the source and drain regions in a self-alignment manner, thereby forming the semiconductor regions for preventing the punch through of the MOS transistor and controlling the inversion threshold voltage. A first improvement in the characteristics is that the impurity concentration in the center of the channel region can be low and the drivability of the transistor is increased because the above-mentioned implantation is conducted by using the gate electrode as a mask. A second improvement is that since the above-mentioned implantation is conducted by using the source and drain electrodes (conductive films covering the source and drain regions) as a mask the impurity concentration near the junctions of the source and drain regions is low to decrease the parasitic junction capacitance, thereby improving the operating speed of the circuit. A third improvement is that the implantation into the LDD regions can be conducted after forming the source and drain regions so that the LDD regions are not affected by the heat treatment for activating the impurities therein. As a result, the short channel effect can be further prevented.

According to the method of Example 5, the first conductivity type impurities are implanted into the semiconductor substrate by the first ion implantation, the tilt ion implantation, using the first conductive film as a mask, thereby forming the first semiconductor region of the first conductivity type. By the second ion implantation using the first conductive film as a mask, the second conductivity type impurities are implanted into the semiconductor substrate, thereby forming the second semiconductor regions of the second conductivity type as parts of the source and drain regions. Then, the second insulating film is formed on the side walls of the first conductive film. By the third ion implantation using the second conductive film and the second insulating film as a mask, the second conductivity type impurities are implanted into the semiconductor substrate, thereby forming the third semiconductor regions of the second conductivity type as parts of the source and drain regions. In this way, a semiconductor transistor device including a first semiconductor region which is thinner than the second and the third semiconductor regions and which can be formed by the side of the second semiconductor region can be produced.

Various other modifications will be apparent to and can be readily made by those skilled in the art without departing from the scope and spirit of this invention Accordingly, it is not intended that the scope of the claims appended hereto be limited to the description as set forth herein, but rather that the claims be broadly construed.

What is claimed is:

1. A method for producing a semiconductor transistor device comprising the steps of:

forming a first insulating film as a gate insulating film on a semiconductor substrate of a first conductivity type;

forming a first conductive film as a gate electrode in the shape of wiring on the first insulating film;

implanting impurities of a second conductivity type into the semiconductor substrate by a first ion implantation using the first conductive film as a mask, so as to form first semiconductor regions of the second conductivity type;

forming a second insulating film on each side wall of the first conductive film and removing portions of the first insulating film so as to expose a surface of the semiconductor substrate thereunder;

depositing a metal on the exposed surface of the semiconductor substrate and a top surface of the first conductive film;

forming a metal compound by allowing the metal to react with the semiconductor substrate and the first conductive film by a heat treatment;

removing unreacted portions of the metal on the second insulating film;

removing the second insulating film; and implanting impurities of the first conductivity type into the semiconductor substrate by a second ion implantation using the metal compound and the first conductive film as a mask, so as to form second semiconductor regions of the first conductivity type in the semiconductor substrate, the second semiconductor regions controlling an inversion threshold voltage of the device and preventing a punch through between the source region and the drain region.

2. A method for producing a semiconductor transistor device comprising the steps of:

forming a first insulating film as a gate insulating film on a semiconductor substrate of a first conductivity type;

forming a first conductive film as a gate electrode in the shape of wiring on the first insulating film;

forming a second insulating film on each side wall of the first conductive film and removing portions of the first insulating film so as to expose a surface of the semiconductor substrate thereunder;

depositing a metal on the exposed surface of the semiconductor substrate and a top surface of the first conductive film;

forming a metal compound by allowing the metal to react with the semiconductor substrate and the first conductive film by a heat treatment;

removing unreacted portions of the metal on the second insulating film;

implanting impurities of a second conductivity type into the semiconductor substrate by a first ion implantation using the first conductive film as a mask, so as to form first semiconductor regions of the second conductivity type;

removing the second insulating film; and implanting impurities of the first conductivity type into the semiconductor substrate by a second ion implantation using the metal compound and the first conductive film as a mask, so as to form second semiconductor regions of the first conductivity type in the semiconductor substrate, the second semiconductor regions controlling an inversion threshold voltage of the device and preventing a punch through between the source region and the drain region.

3. A method according to claim 1 further comprising the steps of:

forming a third semiconductor region of the first conductivity type in the semiconductor substrate of the first conductivity type; and growing a semiconductor film on the semiconductor substrate;

before the step of forming the first insulating film, wherein the first semiconductor region of the second conductivity type is formed in the semiconductor film on the third semiconductor region.

4. A method for producing a semiconductor transistor device comprising the steps of:

forming a first insulating film as a gate insulating film on a semiconductor substrate of a first conductivity type;

forming a first conductive film as a gate electrode in the shape of wiring on the first insulating film;

implanting impurities of a second conductivity type into the semiconductor substrate by a first ion implantation using the first conductive film as a mask so as to form first semiconductor regions of the second conductivity type;

forming a second insulating film on each side wall of the first conductive film and removing portions of the first insulating film so as to expose a surface of the semiconductor substrate thereunder;

forming a second conductive film on the exposed surface of the semiconductor substrate;

removing the second insulating film; and implanting impurities of the first conductivity type into the semiconductor substrate by a second ion implantation using the first conductive film and the second conductive film as a mask, so as to form second semiconductor regions of the first conductivity type in the semiconductor substrate, the second semiconductor regions serving to control an inversion threshold voltage of the semiconductor transistor device and prevent a punch through.

5. A method for producing a semiconductor transistor device comprising the steps of:

forming a first insulating film as a gate insulating film on a semiconductor substrate of a first conductivity type;

forming a first conductive film as a gate electrode in the shape of wiring on the first insulating film;

forming a second insulating film on each side wall of the first conductive film;

forming first semiconductor regions of a second conductivity type in the semiconductor substrate by a first ion implantation using the first conductive film and the second insulating film as a mask;

removing the first insulating film so as to expose a surface of the semiconductor substrate thereunder;

depositing a metal on the exposed surface of the semiconductor device to form a top surface of the first conductive film;

forming a metal compound by allowing the metal to react with the semiconductor substrate and the first conductive film by a heat treatment;

removing unreacted portions of the metal on the second insulating film;

removing the second insulating film;

implanting impurities of the first conductivity type into the semiconductor substrate by a second ion implantation using the metal compound and the first conductive film as a mask, so as to form second semiconductor regions of the first conductivity type in the semiconductor substrate; and implanting impurities of the second conductivity type into the semiconductor substrate by a third ion implantation using the metal compound and the first conductive film as a mask, so as to form a third semiconductor region of the second conductivity type as a part of the source region or the drain region in the semiconductor substrate, wherein an inversion threshold voltage is controlled by the second semiconductor region, thereby preventing a punch through, the first semiconductor region having a higher impurity concentration than that of the third semiconductor region.

6. A method for producing a semiconductor transistor device comprising the steps of:

forming a first insulating film as a gate insulating film on a semiconductor substrate of a first conductivity type;

forming a first conductive film as a gate electrode in a shape of wiring on the first insulating film;

implanting impurities of the first conductivity type into the semiconductor substrate by a first tilt ion implantation using the first conductive film as a mask so as to form first semiconductor regions of the first conductivity type;

implanting impurities of a second conductivity type into the semiconductor substrate by a second ion implantation using the first conductive film as a mask so as to form second semiconductor regions of the second conductivity type;

forming a second insulating film on each side wall of the first conductive film; and implanting impurities of the second conductivity type into the semiconductor substrate by a third ion implantation using the second conductive film and the second insulating film as a mask so as to form third semiconductor regions of the second conductivity type, wherein the first semiconductor regions are thinner than the second and the third semiconductor regions, each of the first semiconductor regions being formed by the side of each of the second semiconductor regions.

7. A method according to claim 2 further comprising the steps of:
   forming a third semiconductor region of the first conductivity type in the semiconductor substrate of the first conductivity type; and
   growing a semiconductor film on the semiconductor substrate;
   before the step of forming the first insulating film,
   wherein said first semiconductor region of the second conductivity type is formed in the semiconductor film on the third semiconductor region.

* * * * *